(12) United States Patent
Goshima et al.

(10) Patent No.: US 8,859,170 B2
(45) Date of Patent: Oct. 14, 2014

(54) PHOTOSENSITIVE MODIFIED POLYIMIDE RESIN COMPOSITION AND USE THEREOF

(75) Inventors: Toshiyuki Goshima, Yokohama (JP); Maw Soe Win, Yokohama (JP); Sigemasa Segawa, Yokohama (JP); Eika Kyo, Yokohama (JP)

(73) Assignee: PI R&D Co., Ltd., Yokohama-Shi (JP)

( * ) Notice: Subject to any disclaimer, the term of this patent is extended or adjusted under 35 U.S.C. 154(b) by 150 days.

(21) Appl. No.: 13/318,058

(22) PCT Filed: Apr. 30, 2010

(86) PCT No.: PCT/JP2010/057679
§ 371 (c)(1),
(2), (4) Date: Dec. 23, 2011

(87) PCT Pub. No.: WO2010/126133
PCT Pub. Date: Nov. 4, 2010

(65) Prior Publication Data
US 2012/0097435 A1    Apr. 26, 2012

(30) Foreign Application Priority Data

Apr. 30, 2009 (JP) ................ 2009-110759

(51) Int. Cl.
| | | |
|---|---|---|
| G03F 7/023 | (2006.01) | |
| G03F 7/40 | (2006.01) | |
| C08L 79/08 | (2006.01) | |
| C08G 18/10 | (2006.01) | |
| C08G 18/34 | (2006.01) | |
| C08G 18/44 | (2006.01) | |
| C08G 18/73 | (2006.01) | |
| C08G 18/76 | (2006.01) | |
| C08G 73/10 | (2006.01) | |
| H05K 3/28 | (2006.01) | |

(52) U.S. Cl.
CPC . C08L 79/08 (2013.01); G03F 7/40 (2013.01); C08G 18/10 (2013.01); C08G 18/346 (2013.01); C08G 18/44 (2013.01); C08G 18/73 (2013.01); C08G 18/7678 (2013.01); C08G 73/1035 (2013.01); C08G 73/1042 (2013.01); G03F 7/0233 (2013.01); H05K 3/287 (2013.01); H05K 2201/0154 (2013.01); Y10S 430/107 (2013.01)

USPC ........... 430/18; 430/191; 430/192; 430/193; 430/326; 430/330; 430/906

(58) Field of Classification Search
CPC ................................. G03F 7/0233; G03F 7/40
USPC ........... 430/18, 191, 192, 193, 326, 330, 906
See application file for complete search history.

(56) References Cited

U.S. PATENT DOCUMENTS

| | | | |
|---|---|---|---|
| 7,952,119 B2 * | 5/2011 | Becker et al. ................. | 257/206 |
| 8,188,209 B2 * | 5/2012 | Naiki et al. ...................... | 528/85 |
| 8,669,038 B2 * | 3/2014 | Park et al. ..................... | 430/192 |
| 2010/0132989 A1 | 6/2010 | Fujihara et al. | |
| 2011/0083884 A1 | 4/2011 | Okada et al. | |
| 2012/0097439 A1 * | 4/2012 | Goshima et al. .............. | 174/258 |

FOREIGN PATENT DOCUMENTS

| | | |
|---|---|---|
| JP | 2003-167336 A | 6/2003 |
| JP | 2008-276174 A | 11/2008 |
| JP | 2009-53646 A | 3/2009 |
| JP | 2009-69664 A | 4/2009 |
| JP | 2009-230076 A | 10/2009 |
| WO | WO 2008/132960 A1 | 11/2008 |
| WO | WO 2010/010831 A1 | 1/2010 |

OTHER PUBLICATIONS

International Search Report for PCT/JP2010/057679, mailed on Jul. 27, 2010.
Extended European Search Report issued Dec. 14, 2012, in European Patent Application No. 10769831.8.

* cited by examiner

*Primary Examiner* — John Chu
(74) *Attorney, Agent, or Firm* — Birch, Stewart, Kolasch & Birch, LLP

(57) ABSTRACT

Disclosed are: a photosensitive modified polyimide resin composition having photo-fabrication property, which is excellent in the electric properties and adhesion as well as in the heat resistance, flexibility, bending property, low warping, chemical resistance and storage stability; a resin film formed from the composition; and a printed circuit board, flexible printed circuit board (FPC) and the like which comprises the film as an insulating protective film and/or interlayer insulation film. The photosensitive modified polyimide resin composition comprises a modified polyimide of a specific structure having a flexible structure such as polycarbonate; a photosensitizer; a curing agent; and a solvent.

11 Claims, No Drawings

PHOTOSENSITIVE MODIFIED POLYIMIDE RESIN COMPOSITION AND USE THEREOF

TECHNICAL FIELD

The present invention relates to: a photosensitive modified polyimide resin composition having photo-fabrication property, which is excellent in the electric properties and adhesion as well as in the heat resistance, flexibility, bending property, low warping, chemical resistance and storage stability; a resin film formed from the composition; and a printed circuit board, flexible printed circuit board (FPC) and the like which comprises the film as an insulating protective film and/or interlayer insulation film.

BACKGROUND ART

In recent years, as an insulating protective film of a flexible circuit board, polyimide resins, polyamideimide resins, polyurethane resins, epoxy resins and the like are used. When preparing a circuit board, a photosensitive material is used to form a patterned circuit, a protective layer of the circuit board surface and the patterned circuit, an interlayer insulation film and the like. Photosensitive materials can be broadly classified into liquid type and film type. In either case, the cured film is required to have excellent flexibility, bending resistance, low warping and the like in addition to excellent heat resistance and electric properties. Polyimides are widely used because of their excellent heat resistance and electric properties; however, since polyimides themselves are rigid, a variety of methods have been proposed to improve the rigidity. One type of the methods is so-called mix-type method in which a polyimide or its precursor, polyamic acid, is mixed with a resin component having flexibility, and the other type is so-called modification-type method in which a flexible component such as a polysiloxane structure is introduced into the polyimide main chain.

As a mixed-type photosensitive material, Patent Document 1 discloses a dry film resist comprising a polyimide resin and a (meth)acrylic resin. However, since the (meth)acrylic compound is often added in a large amount such that curing property and low-temperature laminating property can be imparted, depending on the (meth)acrylic compound, the heat resistance of the dry film resist may be lowered and excellent characteristics of the polyimide may be impaired. Further, the compatibility between the resins also needs to be considered. When the compatibility is extremely bad, the photosensitivity becomes largely variable on the surface, which may result in an impaired reliability in the pattern accuracy, film thickness and the like.

As a modified-type photosensitive material, Patent Document 2 discloses a composition comprising a siloxane-modified polyimide derived from diaminopolysiloxane. This siloxane-modified polyimide has excellent heat resistance and electric insulation property and is also excellent in low warping because of its low elasticity. Yet, there are also problems in that the surface of the cured film does not have sufficient adhesion due to the polysiloxane component and that cyclic siloxane is generated and released during high-temperature heating.

Meanwhile, although they are not photosensitive materials, Patent Document 3 discloses a polycarbonate-modified polyimide resin and Patent Document 4 discloses a composition comprising an ester-modified polyimide resin. These compositions are excellent in low warping and in these compositions, those problems seen in siloxane-modified polyimides, such as insufficient adhesion of the cured film surface and generation of cyclic siloxane, were improved. It is speculated that photosensitivity can be imparted to these modified resins by adding a photosensitive resin composition such as a (meth)acrylic resin as described in Patent Document 1; however, in such a composition having a non-photosensitive resin as its major constituting material, problems that are similar to those of a mixed-type material, such as inconsistent photosensitivity on the surface, tend to arise. In addition, with each resin alone, the chemical resistance tends to be low; therefore, as described in these Patent Documents, an epoxy must be added; however, this lowers the storage stability.

Accordingly, a method in which a modified resin is imparted with photosensitivity, not a mixing-type system, is speculated to be the most appropriate. Patent Document 5 discloses a composition which comprises a polyimide resin having an ether imide skeleton, polycarbonate skeleton and urethane bond, as well as a developing group in the side chain and a photosensitive group at the main chain terminal. In this composition, a (meth)acryloyl group is used as the photosensitive group, and the composition is composed of a (meth)acrylate compound, a photopolymerization initiator and a thermal polymerization initiator. However, since this composition is a so-called negative-type photosensitive composition, although the cured film obtained therefrom has an improved solvent resistance, an epoxy or isocyanate compound must be added as a curing agent, so that there is a problem of bad storage stability. In addition, since it is required to introduce a (meth)acryloyl group to a terminal or the like of the polyimide chain and gelation easily occurs during the polyimide synthesis, the synthesis of the composition is difficult. That is, attention must be paid not to allow the heat applied during the synthesis to trigger a reaction of the (meth)acryloyl group, and the management of the viscosity is also not easy. Besides, since an addition of a polymerization inhibitor inhibits the curing reaction in the exposure process and the resulting product is thus affected, the above-described problems cannot be easily resolved.

Considering the storage stability as well, it is speculated rather easier to employ a positive-type photosensitive resin represented by novolac resins as the resin composition. Specifically, a method in which a hydroxyl group or carboxyl group is introduced into the main chain of a modified polyimide is suitable. However, as described in Patent Documents 3 and 4, since a modified polyimide is synthesized by a reaction between a tetracarboxylic dianhydride and a diisocyanate, hydroxyl group and carboxyl group cannot be introduced. That is, since hydroxyl group and carboxyl group react with isocyanate, they are consumed by cross-linking reaction and the like. Similarly, since the composition of Patent Document 5 is also similarly obtained by allowing a hydroxyl group-terminated ether imide oligomer with a diol compound, (a compound having a (meth)acryloyl group) and a diisocyanate compound, it is difficult to protect the intended hydroxyl group.

PRIOR ART DOCUMENTS

Patent Documents

[Patent Document 1] JP 2003-167336A
[Patent Document 2] JP 2002-174896A
[Patent Document 3] JP 2002-145981A
[Patent Document 4] JP 2008-297388A
[Patent Document 5] JP 2009-69664A

SUMMARY OF THE INVENTION

Problems to be Solved by the Invention

An object of the present invention is to provide: a photosensitive modified polyimide resin composition having photo-fabrication property, which is excellent in the electric properties and adhesion, as well as in the heat resistance, flexibility, bending property, low warping, chemical resistance and storage stability; a resin film formed from the composition; and a printed circuit board, flexible printed circuit board (FPC) and the like which comprises the resin film as an insulating protective film and/or interlayer insulation film.

Means for Solving the Problems

The present inventors intensively studies to discover that a resin composition which comprises a modified polyimide of a specific structure having a flexible structure composed of a repeating unit containing a carbonate group, ester group or urethane group, as well as a free hydroxyl group and/or carbonyl group in the main chain, the resin composition also comprising a photosensitizer and a heat curing agent, has excellent heat resistance, flexibility, bending property, low warping, chemical resistance and storage stability in addition to excellent electric properties and adhesion and exhibits photo-fabrication property, thereby completing the present invention.

That is, the present invention provides a photosensitive modified polyimide resin composition which comprises a modified polyimide represented by the following Formula (I):

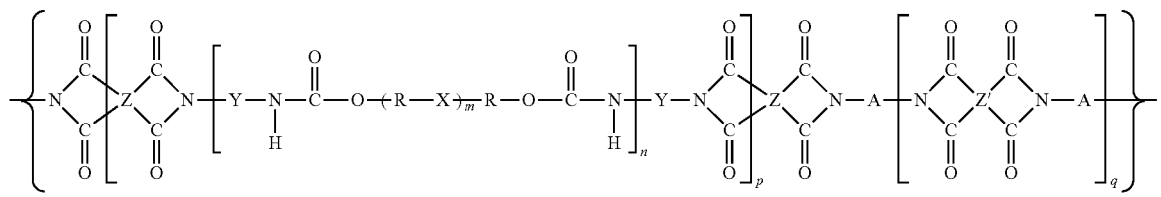

(wherein each R independently represents a $C_1$-$C_{18}$ alkylene group; each X independently represents a carbonate group, ester group or urethane group; each Y independently represents a $C_1$-$C_{18}$ alkylene group or arylene group; A represents a divalent organic group which is the part of a diamine other than the amino groups thereof; Z and Z' represent a tetravalent organic group which is the part of a tetracarboxylic acid other than the carboxyl groups thereof; at least one of A, Z and Z' has a free hydroxyl group and/or carboxyl group; and m, n, p and q each independently represents an integer of 1 to 20);
a photosensitizer; a heat curing agent; and a solvent.

Further, the present invention provides a photosensitive resin film obtained by forming a film of the above-described composition according to the present invention and then heating the thus obtained film to remove the above-described solvent. Still further, the present invention provides a method of producing a patterned polyimide resin film, which comprises the steps of: coating the above-described composition according to the present invention on a substrate to form a film; heating the thus obtained film to remove the above-described solvent; exposing through a mask the above-described composition from which the solvent was removed; developing the resultant after the exposure; and, after the development, heating the resultant to a temperature not lower than the curing temperature of the above-described curing agent. Still further, the present invention provides a printed circuit board or FPC which comprises a patterned polyimide resin film produced by the above-described method according to the present invention.

Effects of the Invention

According to the present invention, a modified polyimide resin paste which may be stored at room temperature and has good storage stability can be obtained, and a photosensitive resin film can also be produced. A coating film formed therefrom is a resin film having excellent electric properties and adhesion, as well as excellent heat resistance, flexibility, bending property, low warping and chemical resistance.

Mode for Carrying out the Invention

As described in the above, the photosensitive resin composition according to the present invention comprises a photosensitive modified polyimide having a structure represented by the above-described Formula (I). In the followings, a method of producing the photosensitive modified polyimide is explained along with preferred photosensitive modified polyimides.

It is preferred that the modified polyimide contained in the resin composition according to the present invention be produced by a method in which an acid anhydride-terminated oligomer represented by Formula (III) below, which is obtained by performing a reaction using an isocyanate-terminated oligomer represented by Formula (II) below as an indispensable component, is used as a starting material for polyimidization reaction, that is, a method in which an acid anhydride-terminated oligomer represented by Formula (III) below is further allowed to react with a diamine and a tetracarboxylic dianhydride to perform polyimidization.

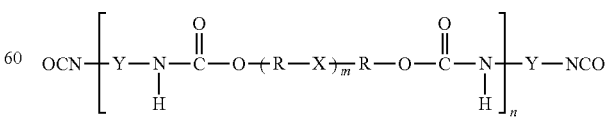

(wherein R, Y, X, m and n each has the same meaning as in the above-described Formula (I))

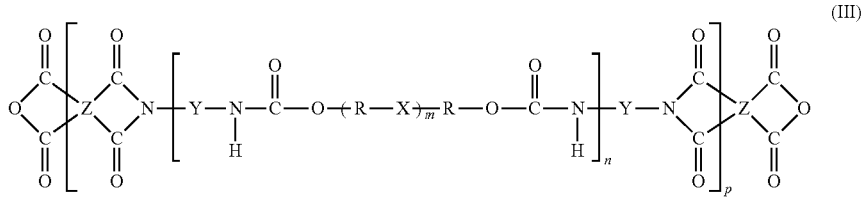

(wherein R, Y, X, Z, m, n and p each has the same meaning as in the above-described Formula (I))

The acid anhydride-terminated oligomer represented by the above-described Formula (III) can be introduced into the imide main chain by allowing it to react with a diol compound represented by Formula (IV):

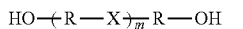

(wherein R, X and m each has the same meaning as in the above-described Formula (I))
and a diisocyanate represented by Formula (V)

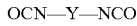

(wherein Y has the same meaning as in the above-described Formula (I)) and then allowing the resultant to further react with a tetracarboxylic dianhydride.

It is desired that the diol compound represented by the above-described Formula (V) be one in which the R is an aliphatic hydrocarbon. A diol compound partially containing an aromatic ring can also be used; however, the resulting film becomes highly elastic and likely to have a problem in the warping property. Further, when the amount of the linking group X in the diol compound is increased, not only the resulting film becomes highly elastic, but also the heat resistance thereof tends to be lowered. The diol compound used here has a number average molecular weight of preferably 500 to 10,000, more preferably 800 to 5,000. It is difficult to obtain a suitable flexibility when the number average molecular weight is less than 500, while when the average molecular weight is greater than 10,000, the viscosity becomes high, impairing the handling property. Specific examples of the diol compound include polycarbonate diol, polyester diol and polyurethane diol, and as the polycarbonate diol used in the present invention, one which is represented by Formula (VI):

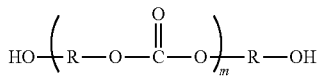

(wherein R and m each has the same meaning as in the above-described Formula (I)) is preferred. In the Formula (VI), it is preferred that the alkylene group represented by R have 2 to 8 carbon atoms and that m be 6 to 16. Preferred specific examples of such polycarbonate diol include commercially available ones such as DURANOL (trade name) T6001, T5651 and T4691 (all of which are manufactured by Asahi Kasei Chemicals Corporation); and PLACCEL (trade name) CD-210, CD-210PL and CD-210HL (all of which are manufactured by Daicel Chemical Industries, Ltd.). Further, as the polyester diol, one which is represented by Formula (VII):

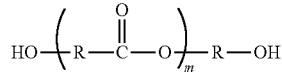

(wherein R and m each has the same meaning as in the above-described Formula (I)) is preferred, and preferred R and m are the same as in the case of the Formula (VI). Preferred specific examples of such polyester diol include PLACCEL (trade name) 210, 210N, and L212AL, all of which are manufactured by Daicel Chemical Industries, Ltd. Further, a polyurethane diol oligomer synthesized by allowing a diisocyanate compound to react with an excess amount of a diol compound can also be used. As such polyurethane diol oligomer, one which is represented by Formula (VIII):

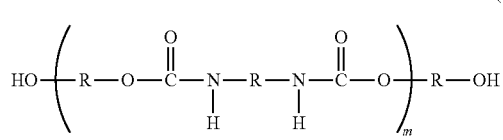

(wherein R and m each has the same meaning as in the above-described Formula (I)) is preferred, and preferred R and m are the same as in the case of the Formula (VI).

These diol compounds are used individually or in combination of two or more thereof.

Further, the above-described diisocyanate represented by the Formula (V) is not particularly restricted, as long as it has a $C_1$-$C_{18}$ alkylene group or arylene group as Y and two isocyanate groups in one molecule. Examples thereof include aliphatic, alicyclic and aromatic diisocyanates, and preferred examples include aliphatic, aliphatic, alicyclic and aromatic diisocyanates having 1 to 18 carbon atoms without counting the isocyanate groups. When an aromatic diisocyanate is used, as compared to a case where an aliphatic diisocyanate is used, the modified polyimide resin tends to have a higher heat resistance and higher elastic modulus. Specific examples of the diisocyanate include 1,4-tetramethylene diisocyanate, 1,5-pentamethylene diisocyanate, 1,6-hexamethylene diisocyanate, 2,2,4-trimethyl-1,6-hexamethylene diisocyanate, isophorone diisocyanate, 1,3-bis(isocyanatemethyl)cyclohexane, 1,4-bis(isocyanatemethyl)cyclohexane, 4,4'-dicyclohexylmethane diisocyanate, 3,3'-dimethyl-4,4')-dicyclohexylmethane diisocyanate, tolylene-2,4-diisocyanate, tolylene-2,5-diisocyanate, tolylene-2,6-diisocyanate, 4,4'-diphenylmethane diisocyanate, 1,5-naphthalene diisocyanate, 2,6-naphthalene diisocyanate and 2,2-bis(4-phenoxyphenyl)propane-4,4'-diisocyanate. Further, for example, a modified product having an isocyanate terminal, such as DURANATE (trade name) D101 or D201 manufactured by Asahi Kasei Chemicals Corporation may also be used. In addition, in order to improve the solvent resistance, a trivalent or higher-valent isocyanate may also be used in such an amount which does not cause gelation, and examples of such isocyanate include trivalent isocyanate products such as DURANATE (trade name) TPA-100 manufactured by Asahi Kasei Chemicals Corporation. Here, in order to avoid changes with time, the above-described isocyanate compounds may also be made into a block compound with an alcohol, phenol, oxime or the like.

The compounding ratio of the above-described carbonate diol represented by the Formula (IV) and the above-described diisocyanate represented by the Formula (V) (the number of isocyanate group/the number of hydroxyl group) is preferably 1.1 to 2.5. When the number of isocyanate group/the number of hydroxyl group is lower than 1.1, the viscosity becomes high, which is problematic at the time of imidization in the later step. On the other hand, when the number of isocyanate group/the number of hydroxyl group is higher than 2.5, reaction between isocyanates simply becomes more likely to occur, which is meaningless.

The reaction can be carried out either in the absence of solvent or in the presence of an organic solvent. It is preferred that the reaction temperature be 40° C. to 180° C. The reaction time can be selected as appropriate depending on the reaction conditions, scale and the like, and it is, for example, about 30 minutes to 2 hours.

By allowing the isocyanate-terminated oligomer obtained in this manner, which is represented by the Formula (II), to react with a tetracarboxylic dianhydride, a tetracarboxylic dianhydride oligomer represented by the Formula (III) is synthesized. The tetracarboxylic dianhydride used here is not particularly restricted; however, specific examples thereof include aromatic tetracarboxylic dianhydrides such as pyromellitic dianhydride, 3,3',4,4'-biphenyltetracarboxylic dianhydride, bis(3,4-dicarboxyphenyl)ether dianhydride, 3,3',4,4'-benzophenone tetracarboxylic dianhydride, 3,3',4,4'-biphenylsulfone tetracarboxylic dianhydride, 2,2-bis(3,4-dicarboxyphenyl)propane dianhydride, 4,4'-(4,4'-isopropylidenediphenoxy)bisphthalic dianhydride, 2,2-bis(3,4-dicarboxyphenyl)hexafluoropropane dianhydride, ethylenebis(trimellitate)dianhydride and p-phenylenebis(trimellitic monoester anhydride); and alicyclic tetracarboxylic dianhydrides such as 1,2,4,5-cyclohexane tetracarboxylic dianhydride, 3,3',4,4'-bicyclohexyl tetracarboxylic dianhydride and bicyclo[2.2.2]oct-7-ene-2,3,5,6-tetracarboxylic dianhydride. These tetracarboxylic dianhydrides are used individually or in combination of two or more thereof.

The compounding ratio of the isocyanate-terminated oligomer represented by the Formula (II) and the tetracarboxylic dianhydride (carboxylic anhydride group/isocyanate group) is preferably not lower than 1.1. When the ratio (carboxylic anhydride group/isocyanate group) is lower than 1.1, the viscosity becomes high, which is problematic at the time of imidization in the later step. Specifically, the tetracarboxylic dianhydride oligomer has a number average molecular weight of preferably 500 to 10,000, more preferably 1,000 to 9,000. When the number average molecular weight is less than 500, the warping property tends to be deteriorated, while when it is greater than 10,000, the reactivity of the terminal acid anhydride tends to be decreased, making it difficult to introduce the oligomer into the polyimide main chain.

It is preferred that the reaction temperature be 80° C. to 200° C. The reaction time can be selected as appropriate depending on the reaction conditions, scale and the like, and it is, for example, 30 minutes to 3 hours. The tetracarboxylic dianhydride oligomer obtained in this manner can also be isolated using a poor solvent such as methanol; however, since this process is not economically efficient, it is most preferred to carry out the subsequent imidization step without isolating the tetracarboxylic dianhydride oligomer.

By the above-described method, the tetracarboxylic dianhydride oligomer represented by the Formula (III) is obtained. In the Formula (III), n is an integer of 1 to 20, preferably an integer of 1 to 4, and p is an integer of 1 to 20, preferably an integer of 1 to 8. It is preferred that the amounts of reaction components be set in such a manner that these ranges are satisfied.

A flexible structure-modified polyimide resin having a hydroxyl group and/or carboxyl group can be produced by dissolving, in an organic solvent, the tetracarboxylic dianhydride oligomer obtained in the above-described manner, which is represented by the Formula (III) and, as required, a tetracarboxylic dianhydride and a diamine which at least partially contains a hydroxyl group or carboxyl group to perform direct imidization. The mixing ratio of the total tetracarboxylic dianhydride(s) and the diamine is preferably 0.95 to 1.05 mol % in terms of the total amount of the diamine with respect to 1 mol % of the total amount of the acid anhydride(s). As the synthesis method, any known method may be employed, and chemical imidization process using a catalyst such as an acetic anhydride/triethylamine-based catalyst or valerolactone/pyridine-based catalyst can be suitably employed.

The diamine compound used here is not particularly restricted; however, since characteristics such as flexibility, bending property and low warping are provided by the flexible structure part such as the polycarbonate structure, an aromatic diamine, rather than an aliphatic or alicyclic diamine having inferior heat resistance and chemical resistance, can be more suitably used. Specific examples of the diamine having a hydroxyl group or carboxyl group include 1,3-diamino-4-hydroxybenzene, 1,3-diamino-5-hydroxybenzene, 1,4-diamino-2-hydroxybenzene, 1,3-diamino-4,6-dihydroxybenzene, 1,4-diamino-2,5-dihydroxybenzene, 3,3'-diamino-4,4'-dihydroxy-1,1'-biphenyl, 4,4'-diamino-3,3'-dihydroxy-1,1'-biphenyl, 3,3'-diamino-4,4'-dihydroxydiphenylsulfone, 2,2-bis(3-amino-4-hydroxyphenyl)hexafluoropropane, 2,5-diaminobenzoic acid, 3,5-diaminobenzoic acid and 4,4'-diaminodiphenylmethane-3,3'-dicarboxylic acid. These diamines are used individually or in combination of two or more thereof.

Further, in order to improve the heat resistance and chemical resistance and adjust the developing performance, a diamine which does not have a hydroxyl group or carboxyl group can be used at the same time. Examples of such diamine include m-phenylenediamine, p-phenylenediamine, 2,4-diaminotoluene, 2,6-diaminopyridine, 2,6-diamino-4-methylpyridine, 4,4'-diamino-2,2'-dimethyl-1,1'-biphenyl, 4,4'-diamino-3,3'-dimethyl-1,1'-biphenyl, 3,4'-diaminodiphenylether, 4,4'-diaminodiphenylether, 4,4'-diaminodiphenylmethane, 3,3'-diaminodiphenylsulfone, 4,4'-diaminodiphenylsulfone, 4,4'-diaminodiphenyl sulfide, 1,3-bis(3-aminophenoxy)benzene, 1,3-bis(4-aminophenoxy)benzene, 1,4-bis(4-aminophenoxy)benzene, 2,2-bis(4-aminophenyl)propane, α,α-bis(4-aminophenyl)-1,3-diisopropylbenzene, α,α-bis(4-aminophenyl)-1,4-diisopropylbenzene, [3-(4-aminobenzoyl)oxyphenyl]-4-aminobenzoate, [4-(4-aminobenzoyl)oxyphenyl]-4-aminobenzoate, 4,4'-bis(4-aminophenoxy)biphenyl, 2,2-bis[4-(4-aminophenoxy)phenyl]propane, bis[4-(3-aminophenoxy)phenyl]sulfone, bis[4-(4-aminophenoxy)phenyl]sulfone, 4,4'-(9-fluorenylidene)dianiline, 5(6)-amino-1-(4-aminophenyl)-1,3,3-trimethylindane, 4,4'-diamino-2,2'-di-trifluoromethyl-1,1'-biphenyl, 2,2-bis(4- aminophenyl)hexafluoropropane, 2,2-bis[4-(4-aminophenoxy)phenyl]hexafluoropropane and 2,2-bis(3-amino-4-methylphenyl)hexafluoropropane. These diamines are used individually or in combination of two or more thereof.

In addition, in order to improve the chemical resistance, a reactive group can be introduced to a terminal of the modified polyimide. For example, by adding the tetracarboxylic acid in a slightly larger amount such that the modified polyimide has an acid anhydride terminal and then carrying out the synthesis, followed by an addition of an amine compound such as 3-ethinylaniline or 4-ethinylaniline, an acetyl group can be introduced to the polymer terminal. Further, by adding the diamine compound in a slightly larger amount such that the modified polyimide has an amine terminal and then carrying out the synthesis, followed by an addition of an acid anhydride such as maleic anhydride, ethinylphthalic anhydride or phenylethinylphthalic anhydride, a double bond or triple bond, which is a reactive group, can also be introduced in the same manner. These terminal groups react with each other when heated at a temperature of not lower than 150° C., so that the polymer main chains are cross-linked.

Further, as the tetracarboxylic dianhydride used here as required, a tetracarboxylic dianhydride similar to the one used in the synthesis of the oligomer of the above-described Formula (III) can be employed, and it may be the same as or different from the one used in the synthesis of the oligomer of the above-described Formula (III).

Further, in the modified polyimide composition according to the present invention, the weight ratio of the repeating units whose number is represented by the n to the weight of the modified polyimide resin in the production (with the proviso that the weight of Y is excluded with Y is aromatic) is preferably 0.3 to 0.7, more preferably 0.4 to 0.65. When the weight ratio is lower than 0.3, low warping is not satisfied, while when it is higher than 0.7, the heat resistance and chemical resistance tend to be lowered.

The polyimide resin obtained in this manner has a number average molecular weight of preferably 6,000 to 60,000, more preferably 7,000 to 50,000. When the number average molecular weight is less than 6,000, the physical properties of the film, such as breaking strength, tend to be impaired, while when it is greater than 60,000, it becomes difficult to obtain a paste having suitable ease of handling.

By the above-described method, the modified polyimide represented by the above-described Formula (I) is obtained. In the Formula (I), q is preferably 1 to 10, and it is preferred that the oligomer represented by the Formula (I) be allowed to react with the above-described diamine and tetracarboxylic dianhydride in such a manner that q is in this range.

As the synthetic solvent used in the present invention, a solvent having a vapor pressure at 25° C. of not higher than 3 mmHg, more preferably not higher than 1 mmHg, can be used. Specific examples of such solvent include γ-butyrolactone, triglyme, tetraglyme, methyl benzoate, ethyl benzoate, ethylcarbitol acetate and butylcarbitol acetate, and these solvents can be used individually or in combination of two or more thereof. Further, in order to adjust the viscosity at the time of preparing a resin composition, a ketone-based solvent such as cyclohexanone or a carbonate-based solvent such as ethylene carbonate or propylene carbonate may also be used as a diluent.

The photosensitive modified polyimide resin composition according to the present invention comprises the above-described modified polyimide, a photosensitizer, a heat curing agent and a solvent.

Since the alkali dissolution rate can be controlled by the amount of hydroxyl group and/or carboxyl group, the modified polyimide used in the present invention can be either a positive-type photosensitive one whose exposed portion is dissolved or a negative-type photosensitive one whose non-exposed portion is dissolved; however, when high definition and high resolution are required, it is preferred that the composition according to the present invention comprise a positive-type photosensitive modified polyimide which does not cause a problem of swelling or the like.

In cases where the modified polyimide is negative-type photosensitive one, the photosensitizer is a photoreaction initiator, such as a photoradical generator represented by benzoin-based and acylphosphine oxide-based ones, a photoacid generator represented by onium salts or a photobase generator represented by nitrobenzyl carbamate, or a monomer or polymer in which polymerization or cross-linking reaction is triggered by these initiators. Examples of the monomer used here include (meth)acrylic compounds such as ethylene glycol diacrylate. The content of such negative-type photosensitizer in the resin composition is usually about 10 to 100 parts by weight, preferably about 20 to 60 parts by weight, with respect to 100 parts by weight of the polyimide.

In cases where the modified polyimide is positive-type photosensitive one, the photosensitizer is not particularly restricted as long as it is a commonly-used phenol novolac-based photosensitizer; however, an ortho-naphthoquinonediazide compound which is the most easily available can be suitably used. Generally, a reaction product of ortho-naphthoquinonediazide sulfonic chloride and a compound having a phenolic hydroxyl group is employed. Examples of such phenolic compound include phenol, hydroquinone, resorcinol, catechol, 2,4-dihydroxy benzophenone, 2,3,4-trihydroxy benzophenone, 2,2',4,4'-tetrahydroxy benzophenone, 2,3,4,4'-tetrahydroxy benzophenone, 2,2',3,4,4'-pentahydroxy benzophenone, 2,4-dihydroxyacetophenone, 2,5-dihydroxyacetophenone, 2,6-dihydroxyacetophenone, 3,5-dihydroxyacetophenone, 2,3,4-trihydroxyacetophenone, 2,4,6-trihydroxyacetophenone, 2,2-bis(4-hydroxyphenyl)propane, α,α,α'-trimethyl-α,α',α'-tri(p-hydroxyphenyl)-p-xylene, 2,2-bis(4-hydroxyphenyl)hexafluoropropane, bis(4-hydroxyphenyl)methane, bis(4-hydroxyphenyl)sulfone, 4,4'-biphenyldiol, 2,2-bis(2,3,4-trihydroxyphenyl)propane and 4,4'-dihydroxyphenylsulfone. The positive-type photosensitizers, such as ortho-naphthoquinonediazide sulfonic acid ester compounds having these structures, are used individually or in combination of two or more thereof. Further, the content of such positive-type photosensitizer(s) in the resin composition is usually about 5 to 30 parts by weight, preferably about 10 to 25 parts by weight, with respect to 100 parts by weight of the polyimide.

Examples of the curing agent contained in the resin composition according to the present invention include epoxy compounds such as EPIKOTE 828 (manufactured by Yuka Shell Epoxy K. K.), oxazoline compounds such as 2,2'-(1,3-phenylene)bis-2-oxazoline (manufactured by Mikuni Pharmaceutical Industrial Co., Ltd.), benzoxazine compounds such as BF-BXZ (manufactured by Konishi Chemical Ind. Co., Ltd.) and bismaleimides such as BMI-1000 (manufactured by Daiwa Fine Chemicals Co., Ltd.). These curing agents are used individually or in combination of two or more thereof. Further, the content of such curing agent(s) in the resin composition is usually about 5 to 30 parts by weight, preferably about 10 to 25 parts by weight, with respect to 100 parts by weight of the polyimide.

The resin composition according to the present invention may be either in the form of a liquid containing the above-described components in a solvent or a dry-type which does not contain a solvent. As the solvent, the reaction solvent used in the modified polyimide production can be used as is, and preferred solvents are as described in the above.

In the modified polyimide resin composition according to the present invention, although the modified polyimide resin provides satisfactory low warping, with the resin alone, there is still an unresolved problem with respect to the flame retardancy. Therefore, for those applications requiring flame retardancy, it is preferred that the composition comprise a non-halogen-based flame retardant in an amount of 1 to 20 parts by weight, more preferably 5 to 15 parts by weight, with respect to 100 parts by weight of the modified polyimide resin. The non-halogen-based flame retardant is not particularly restricted as long as it does not considerably impair the photosensitivity, and as a flame retardant which is soluble in an organic solvent, a phosphorus-based flame retardant such as a phosphate compound, phosphazene compound, triphenyl phosphate or cyclic phenoxyphosphazene is particularly suitably employed. Further, examples of a non-halogen-based inorganic flame retardant include metal hydrate flame retardants such as aluminum hydroxide, and these flame retardants can be used individually or in combination of two or more thereof.

Further, in the modified polyimide resin composition according to the present invention, a coloring agent such as phthalocyanine blue or phthalocyanine green and/or a filler such as silica may be added as required in such an amount which does not affect the photosensitivity. In addition, for example, a photosensitizing agent, alkali dissolution promoter, adhesion aid, antifoaming agent and/or leveling agent may also be added.

The modified polyimide resin composition produced in this manner can be applied by a bar coater, roll coater, spin coater, screen printing or the like. Further, the modified polyimide resin composition can also be used to prepare a photosensitive coverlay. In this case, in order to improve the embedding property in heat pressing, a plasticizer such as a (meth) acrylic compound may also be employed.

Further, the photosensitive modified polyimide resin composition according to the present invention can also be made into the form of a film to be used as a dry film. In this case, it is preferred that the photosensitive modified polyimide resin composition comprise (A) an alkali-soluble modified polyimide resin, (B) a photo sensitizer and (C) a plasticizer. By containing a plasticizer, the Tg of the composition is lowered, so that there are such effects that the press-bonding becomes easier and that the warpage in the dry film formation is reduced.

The plasticizer used in the photosensitive modified polyimide resin composition according to the present invention is not particularly restricted as long as it is capable of imparting plasticity to the resin composition and lowering the Tg of the composition. Examples of such plasticizer include ether compounds such as polyethylene glycol, polypropylene glycol and crown ether; methacryl group-containing compounds such as tetraethylene glycol dimethacrylate and polyethylene glycol dimethacrylate; acryl group-containing compounds such as tetraethylene glycol diacrylate and polyethylene glycol diacrylate; phthalates such as dimethyl phthalate and diethyl phthalate; trimellitates such as tris(2-ethylhexyl)trimellitate; aliphatic dibasic esters such as dimethyl adipate and dibutyl adipate; phosphates such as trimethyl phosphate and tris(butoxyethyl)phosphate; aromatic condensed phosphates such as those represented by $(C_6H_5O)_2P(O)OC_6H_4C(CH_3)_2C_6H_4OP(O)(OC_6H_5)_2$; and isocyanuric acid ethylene glycol-modified diacrylates. Among these, from the standpoint of the warpage after the dry film formation, methacryl group-containing compounds and isocyanuric acid ethylene glycol-modified diacrylates are more preferred.

In the photosensitive modified polyimide resin composition according to the present invention, from the standpoint of attaining sufficient plasticity, it is preferred that the plasticizer be added in an amount of not less than 5 parts by weight and not greater than 30 parts by weight, with respect to 100 parts by weight of the (A) alkali-soluble modified polyimide resin. Further, from the standpoint of the flame retardancy of the cured body, it is more preferred that the amount of the plasticizer be not less than 5 parts by weight and not greater than 20 parts by weight. The photosensitive resin composition according to the present invention may comprise, as required, a solvent capable of uniformly dissolving and/or dispersing the (A) alkali-soluble modified polyimide resin, (B) photosensitizer, (C) flame retardant and (D) plasticizer. As the solvent, the above-described solvent used in the modified polyimide resin composition can be employed. The photosensitive modified polyimide resin composition according to the present invention can be suitably used for a photosensitive film. From the standpoint of producing a photosensitive film, the concentration of the modified polyimide in the photosensitive resin composition is preferably not lower than 10% by weight and not higher than 70% by weight. From the standpoint of the thickness of the photosensitive film, the concentration of the modified polyimide is preferably not lower than 10% by weight, and from the standpoints of the viscosity of the photosensitive resin composition and the uniformity in the film thickness, the concentration of the modified polyimide is preferably not higher than 70% by weight. Further, from the standpoint of the thickness of the resulting photosensitive film, the concentration of the modified polyimide is more preferably not lower than 20% by weight and not higher than 60% by weight.

The method of producing the photosensitive film according to the present invention will now be explained First, the photosensitive resin composition according to the present invention which comprises a solvent is coated on a substrate. The above-described substrate is not particularly restricted as long as it is a substrate which is not damaged during the formation of a photosensitive dry film. Examples of such substrate include silicon wafers, glasses, ceramics, heat-resistant resins and carrier films. Examples of carrier film used in the present invention include polyethylene terephthalate films and metal films. From the standpoint of good ease of handling, heat-resistant resins and carrier films are preferred, and from the standpoint of the releasing property after heat-pressing on the substrate, polyethylene terephthalate films are particularly preferred. Next, by drying the solvent contained in the coated resin composition, the photosensitive resin film according to the present invention can be obtained. The drying conditions are not particularly restricted; however, the drying is usually carried out at a temperature of about 60° C. to 130° C. for about 10 to 60 minutes.

A patterned polyimide resin film can be prepared using the photosensitive resin composition according to the present invention. This method comprises the steps of: coating the photosensitive resin composition on a substrate to form a film; heating the thus obtained film to remove the above-described solvent; exposing through a mask the above-described composition from which the solvent was removed; developing the resultant after the exposure; and, after the development, heating the resultant to a temperature not lower than the curing temperature of the above-described curing agent.

Here, the method of coating the photosensitive modified polyimide resin composition on a substrate is not particularly restricted. The coating can be carried out by, for example, screen printing, and examples of the method also include spin coating, spray coating, die coating, doctor knife coating and flexographic printing. The exposure can be carried out through a photomask having an arbitrary pattern, usually by irradiating the composition with UV light, X-ray, electron beam or the like at a dose of 200 to 2,000 mJ. As the developing solution, an alkaline developing solution, for example, an aqueous solution of inorganic alkali such as sodium hydroxide, potassium hydroxide, sodium carbonate, sodium silicate, sodium metasilicate or aqueous ammonia can be employed. The development is usually carried out at a temperature of about 15° C. to 60° C. for about 0.5 to 10 minutes. The heating for curing is usually carried out at a temperature of about 120° C. to 200° C. for about 30 to 120 minutes. By this method, using a printed circuit board or FPC board with wiring as the substrate, a protective film and interlayer insulation film thereof having an arbitrary pattern can be formed. In the followings, the protective film and interlayer insulation film will be further explained.

That is, in a preferred embodiment, the above-described photosensitive modified polyimide resin composition according to the present invention can be used to form a protective film of a FPC, as well as to form a photosensitive resin film. This photosensitive resin film can be formed by, for example, a method of coating the photosensitive resin composition on a PET film or the like subjected to an appropriate releasing treatment. Examples of the coating method include bar coating, roller coating, die coating, blade coating, dip coating, doctor knife coating, spray coating, flow coating, spin coating, slit coating and brush coating. After the coating, by performing, as required, a heat treatment called prebaking using a hot plate or the like to remove the solvent contained in the composition, the photosensitive resin film can be produced. This photosensitive resin film can be used as a photosensitive dry film resist. In this manner, when using a photosensitive film composed of the photosensitive resin composition according to the present invention, after coating a solution of the photosensitive resin composition on an arbitrary substrate by an arbitrary method, the resultant is dried to form a dry film and made into, for example, a laminate film having a carrier film and the photosensitive film. Alternatively, a laminate film can be prepared by providing at least one arbitrary antifouling or protective cover film on the photosensitive film. In the laminate film according to the present invention, the cover film is not particularly restricted as long as it is a film which protects the photosensitive film, such as low-density polyethylene.

In the method of producing a protective film (cover lay) of FPC using the above-described positive-type photosensitive modified polyimide resin composition according to the present invention, this positive-type photosensitive modified polyimide resin composition is coated on a FPC board having wiring formed thereon to form a film, and the thus obtained film is then heated to remove the above-described solvent. Thereafter, the resultant is exposed through a mask and developed to obtain a positive-type pattern, and the resulting film is then heated to perform cross-linking of the solvent-soluble heat-resistant resin, thereby a protective film of FPC is produced.

Thus, the present invention also provides a printed circuit board or FPC comprising a patterned polyimide resin film prepared in such a manner as described in the above.

The method of producing the polyimide solution used in the present invention and its characteristics will now be specifically described by way of examples and comparative examples. It is noted here, however, that, since there is no difference among a polycarbonate-modified polyimide, polyester-modified polyimide and polyurethane-modified polyimide from the viewpoint that a modified polyimide is synthesized from a diol compound, described herein are only those examples where a polycarbonate diol was used. Furthermore, since a polyimide having a variety of characteristics can be obtained using a combination of a diol compound, diisocyanate compound, tetracarboxylic dianhydride and diamine, the present invention is not restricted to these examples.

EXAMPLES

Synthesis Example 1

To a 2-L three-necked separable flask attached with a stainless steel anchor agitator, a ball condenser equipped with a water separation trap was attached. To the flask, 98.60 g (100 mmol) of DURANOL T5651 (polycarbonate diol manufactured by Asahi Kasei Chemicals Corporation) [molecular weight: 986 (calculated from the hydroxyl group value)], 106.40 g of (200 mmol) of DURANATE D201 (diisocyanate manufactured by Asahi Kasei Chemicals Corporation) [molecular weight: 532 (calculated from the % by weight of isocyanate)] and 156 g of γ-butyrolactone (γBL) were added. After stirring the resulting mixture at 200 rpm for 15 minutes at room temperature under nitrogen atmosphere, the mixture was heated to 140° C. and stirred for 1 hour. Then, 62.04 g (200 mmol) of bis(3,4-dicarboxyphenyl)ether dianhydride (ODPA) and 156 g of γBL were added, and the resultant was allowed to react for 1.5 hours with stirring at 200 rpm at 170° C. After cooling the mixture to room temperature, 28.73 g (70 mmol) of ethylenebis(trimellitate)dianhydride, 16.82 g (60 mmol) of 3,3'-diamino-4,4'-dihydroxydiphenylsulfone (ABPS), 17.18 g (60 mmol) of 4,4'-diaminodiphenylmethane-3,3'-dicarboxylic acid (MBAA), 21.62 g (50 mmol) of bis[4-(4-aminophenoxy)phenyl]sulfone (BAPS), 312 g of ethyl benzoate, 70 g of toluene, 3.0 g (30 mmol) of γ-valerolactone and 4.8 g (60 mmol) of pyridine were further added, and the resultant was allowed to react for 3.5 hours with stirring at 200 rpm at 170° C. The refluxed materials were removed from the system to obtain a polyimide solution having a concentration of 35%.

Synthesis Example 2

The same apparatus as in Synthesis Example 1 was used. To the flask, 118.32 g (120 mmol) of DURANOL T5651, 40.37 g (240 mmol) of hexamethylene diisocyanate (HDI) and 165 g of γ-butyrolactone (γBL) were added. After stirring the resulting mixture at 200 rpm for 15 minutes at room temperature under nitrogen atmosphere, the mixture was heated to 140° C. and stirred for 1 hour. Then, 55.84 g (180 mmol) of ODPA and 166 g of γBL were added, and the resultant was allowed to react for 1.5 hours with stirring at 200 rpm at 170° C. After cooling the mixture to room temperature, 35.31 g (120 mmol) of 3,3',4,4'-biphenyltetracarboxylic dianhydride (BPDA), 33.64 g (120 mmol) of ABPS, 17.18 g (60 mmol) of MBAA, 331 g of γBL, 70 g of toluene, 3.0 g (30 mmol) of γ-valerolactone and 4.8 g (60 mmol) of pyridine were further added, and the resultant was allowed to react for 4.5 hours with stirring at 200 rpm at 170° C. The refluxed materials were removed from the system to obtain a polyimide solution having a concentration of 30%.

Synthesis Example 3

The same apparatus as in Synthesis Example 1 was used. To the flask, 157.76 g (80 mmol) of DURANOL T5652 (molecular weight: 1972 (calculated from the hydroxyl group value)], 33.63 g (160 mmol) of 1,5-naphthalene diisocyanate (NDI) and 172 g of γBL were added. After stirring the resulting mixture at 200 rpm for 15 minutes at room temperature under nitrogen atmosphere, the mixture was heated to 140° C. and stirred for 1 hour. Then, 49.64 g (160 mmol) of ODPA and 171 g of γBL were added, and the resultant was allowed to react for 1.5 hours with stirring at 200 rpm at 170° C. After cooling the mixture to room temperature, 32.83 g (80 mmol) of ethylenebis(trimellitate)dianhydride, 40.36 g (144 mmol) of ABPS, 6.57 g (16 mmol) of 2,2-bis[4-(4-aminophenoxy)phenyl]propane, 228 g of triglyme, 80 g of toluene, 2.5 g (25 mmol) of γ-valerolactone and 3.9 g (50 mmol) of pyridine were further added, and the resultant was allowed to react for 4 hours with stirring at 200 rpm at 170° C. The refluxed materials were removed from the system to obtain a polyimide solution having a concentration of 35%.

Synthesis Comparative Example 1

The same apparatus as in Synthesis Example 1 was used. To the flask, 133.11 g (135 mmol) of DURANOL T5651, 45.41 g (270 mmol) of HDI and 155 g of γBL were added. After stirring the resulting mixture at 200 rpm for 15 minutes at room temperature under nitrogen atmosphere, the mixture was heated to 140° C. and stirred for 1 hour. Then, 55.84 g (180 mmol) of ODPA and 155 g of γBL were added, and the resultant was allowed to react for 1.5 hours with stirring at 200 rpm at 170° C. After cooling the mixture to room temperature, 39.72 g (135 mmol) of BPDA, 77.85 g (180 mmol) of bis[4-(4-aminophenoxy)phenyl]sulfone, 310 g of γBL, 70 g of toluene, 3.2 g (32 mmol) of γ-valerolactone and 5.0 g (64 mmol) of pyridine were further added, and the resultant was allowed to react for 3 hours with stirring at 200 rpm at 170° C. The refluxed materials were removed from the system to obtain a polyimide solution having a concentration of 35%.

The physical properties of the polyimide resins obtained in the above-described Synthesis Examples and Synthesis Comparative Example were evaluated in accordance with the following methods. The results thereof are shown in Table 1 below.

The thus obtained modified polyimide resins having a copolymerized polycarbonate structure were subjected to gel permeation chromatography (GPC: HLC-8220GPC manufactured by Tosoh Corporation) to determine the weight average molecular weight (Mw), number average molecular weight (Mn) and distribution (Mw/Mn). TSKgel GMHHR-H manufactured by Tosoh Corporation was used as the column and a mixture obtained by dissolving LiBr in NMP at a concentration of 0.1N was used as the carrier solvent. The molecular weight was calculated in terms of standard polystyrene (TSK standard polystyrene).

Samples for the measurement of the glass transition temperature (Tg), thermal decomposition temperature, elongation and elastic modulus were prepared as follows. Each of the obtained modified polyimide resins was coated on a copper foil F2-WS (18 μm) manufactured by Furukawa Circuit Foil Co., Ltd. by screen printing to a film thickness of 15±2 μm, and the resulting thin film was dried and heat-treated at 120° C. for 60 minutes and then at 180° C. for 30 minutes. The copper foil was then etched away to prepare a sample film.

Samples for the measurement of the warping property were prepared by coating each of the obtained modified polyimide resins on a 25 μm-thick KAPTON film by screen printing to a film thickness of 15±2 μm and drying the resulting thin film at 120° C. for 60 minutes and then at 180° C. for 30 minutes. The warpage was evaluated in terms of the height of the warped edge, and the symbols "⊚", "○" and "Δ" were assigned when the warpage was measured to be not larger than 1 mm, not larger than 10 mm and not smaller than 10 mm, respectively, and when the warpage was too large to be measured, the symbol "x" was assigned.

Samples for the evaluation of the chemical resistance were prepared in the same manner as those samples for the measurement of the glass transition temperature (Tg), except that the copper foil was not etched. The examined chemicals were 1N aqueous sodium hydroxide solution and an organic solvent, methyl ethyl ketone. The symbol "⊚" was assigned when the film had a glossy surface and did not attain a decrease in the film thickness. The symbols "○" and "Δ" were assigned when the decrease in the film thickness was not greater than 0.1 μm and 0.2 to 0.9 μm, respectively, and when the film lost its glossiness or the film thickness decreased by not less than 1.0 μm, the symbol "x" was assigned.

TABLE 1

Physical Properties of the Polyimide Resins obtained in the Synthesis Examples and Synthesis Comparative Example

| | Unit | Example 1 | Example 2 | Example 3 | Comparative Example 1 |
|---|---|---|---|---|---|
| Diisocyanate | | D201 | HDI | NDI | HDI |
| Weight ratio of flexible structure | % | 61 | 56 | 52 | 54 |
| Number average molecular weight (Mn) | | 11,000 | 9,000 | 42,000 | 21,000 |
| Glass transition temperature (Tg) | ° C. | 87 | 97 | 140 | 122 |
| Thermal decomposition temperature (reduction of 5% by weight) | ° C. | 287 | 315 | 328 | 289 |
| Elongation | % | >200 | >200 | >200 | >200 |
| Elastic modulus | GPa | 1.06 | 1.15 | 0.69 | 0.61 |
| Warping property | | ○ | ○ | ○ | ⊚ |
| Chemical resistance | | ○ | Δ | ⊚ | ○ |

Examples 1 to 8 and Comparative Examples 1 to 3

Production of Positive-type Photosensitive Resin Composition

To each varnish (base varnish) obtained in Synthesis Examples 1 and 2 and Synthesis Comparative Example 1, naphthoquinonediazide sulfonic acid ester (DTEP-350, PA-6: manufactured by Daito Chemix Corporation; 4NT-300: manufactured by Toyo Gosei Co., Ltd.) used as photosensitizer and flame retardant (SPB-100: manufactured by Otsuka Chemical Co., Ltd.; PX-200: manufactured by Daihachi Chemical Industry Co., Ltd.; EXOLIT OP 935 manufactured by Clariant Japan) were added in such amounts as shown in Table 2 with respect to the polymer solid content, and each resultant was mixed to prepare a photosensitive modified polyimide resin composition (photosensitive ink). Here, a leveling agent (XL480 manufactured by Cytec) was added in an amount of about 1 wt % with respect to the polymer solid content, and a positive-type photosensitive modified polyimide resin composition was obtained by, after the final mixing with stirring, performing deaeration under vacuum.

Evaluation of Developing Property: Photosensitive Development Experiment

After coating each of the positive-type photosensitive modified polyimide resin compositions obtained in this manner on a copper foil F2-WS (18 μm) manufactured by Furukawa Circuit Foil Co., Ltd. by screen printing, the solvent in the composition was removed by prebaking the resultant (90° C.×30 minutes) to obtain a photoresist film having a thickness of 13 to 17 μm. On the thus photoresist-containing coating films, a test pattern for a positive-type photomask (through holes and line-and-space pattern having diameters and widths of 10, 15, 20, 25, . . . , and 200 μm, respectively) was placed, and the resulting coating films were irradiated using a 2kW ultra-high-pressure mercury lamp apparatus (JP-2000G: manufactured by ORC Manufacturing Co., Ltd.) at an exposure dose at which an image is obtained. The samples irradiated at an exposure dose of 500 to 2,000 mJ were spray-developed with a developing solution (2% aqueous sodium hydroxide solution). In cases where the irradiation was performed at an exposure dose of 1,000 mJ, the development was carried out with the developing solution at 40° C. for 0.5 to 30 minutes, and after washing the resultants with deionized water and drying them in a hot air drying oven, the image resolution was observed. These polyimide coating films had a polyimide thickness of about 16 μm when dried at 120° C. for 60 minutes and then at 180° C. for 30 minutes. The results of measuring the diameter of the through-hole pattern and the line width of the line-and-space pattern of the copolymerized polyimide coating films obtained by the above-described method are shown in Table 2.

Examples 1 to 6 and Comparative Examples 1 to 4

For the photosensitive modified polyimide resin compositions shown in the above Table 2, the following items were evaluated and the results thereof are shown in Table 3.

The flame-retardant modified polyimide compositions were each coated on a substrate by screen printing using a 165-3D mesh stainless steel plate, and the resultants were prebaked in a hot air oven (90° C.×30 minutes) to remove the solvent contained in the composition, thereby obtaining photoresist films having a thickness of 14 to 17 μm. The thus obtained photoresist-containing coating films were developed with a developing solution at 40° C. for 2 minutes, and the resultants were washed with deionized water and dried in a hot air oven at 120° C. for 60 minutes and then at 180° C. for 30 minutes. The resulting polyimide films had a thickness of about 15 μm. These films were bent at an angle of 180° with the coated side being bent toward outside, and the presence or absence of breaking was judged by visual observation. The judging criteria were as follows.

○: No breakage of the dry film
x: Presence of breakage of the dry film or occurrence of cracking Solder Heat Resistance In accordance with the test method of JIS C-6481, each of the photosensitive modified polyimide compositions shown in Table 2, which were obtained by the above-described film preparation method of Examples 1 to 6 and Comparative Examples 1 to 4, was coated on a substrate [ESPANEX (registered trademark) MC18-25-00FRM, manufactured by Nippon Steel Chemical Co., Ltd.] to prepare test samples. The thus obtained test pieces were coated with a rosin-based flux, and after each cycle of being floated in a solder bath at 260° C. for 5 seconds, the films were dried and visually observed. The solder heat resistance was expressed as the maximum number of cycles that were repeated with confirmation of no change in the respective film without any "swelling", "blistering" or "solder penetration".

TABLE 2

| Example/Comparative Example | Varnish Synthesis Example/Comparative Example | Concentration of polyimide solid content (%) | Exposure dose (mj/cm2) | Photosensitizer type | Added amount (part) | Flame retardant type | Added amount (part) | Defoaming agent type | Added amount (part) | Hole pattern diameter (μm) | Line width (L/S) (μm) |
|---|---|---|---|---|---|---|---|---|---|---|---|
| Example 1 | Example 1 | 30 | 1000 | DTEP350 PA6 | 15 | SPB100 | 10 | XL480 | 1 | 40 | 30/30 |
| Example 2 | Example 1 | 30 | 1000 | DTEP350 PA6 | 15 | PX200 | 10 | XL480 | 1 | 60 | 50/50 |
| Example 3 | Example 1 | 30 | 1000 | 4NT-300 PA6 | 15 5 | OP935 | 10 | XL480 | 1 | 50 | 50/50 |
| Example 4 | Example 2 | 30 | 1000 | 4NT-300 PA6 | 15 5 | PX200 | 10 | XL480 | 1 | 50 | 50/50 |
| Example 5 | Example 2 | 30 | 1000 | DTEP350 PA6 | 15 5 | SPB100 | 10 | XL480 | 1 | 50 | 50/50 |
| Example 6 | Example 2 | 30 | 1000 | 4NT-300 PA6 | 15 — | OP935 | 10 | XL480 | 1 | 50 | 50/50 |
| Example 7 | Example 3 | 30 | 1000 | DTEP350 PA6 | 15 5 | SPB100 | 10 | XL480 | 1 | 50 | 50/50 |
| Example 8 | Example 3 | 30 | 1000 | DTEP350 PA6 | 15 5 | PX200 | 10 | XL480 | 1 | 50 | 50/50 |
| Comparative Example 1 | Comparative Example 1 | 30 | 1000 | DTEP350 PA6 | 15 — | SPB100 | 10 | XL480 | 1 | Could not be developed | |
| Comparative Example 2 | Comparative Example 1 | 30 | 1000 | DTEP350 PA6 | 15 5 | PX200 | 10 | XL480 | 1 | Could not be developed | |
| Comparative Example 3 | Comparative Example 1 | 30 | 1000 | 4NT-300 PA6 | 20 5 | OP935 | 10 | XL480 | 1 | Could not be developed | |

Note
[1] The contents of the photosensitizer, flame retardant and antifoaming agent are indicated as the amount added (parts by weight) with respect to 100 parts by weight of the polyimide resin solid content.

Flammability

Test pieces used for flammability test were prepared by the following method. A 20 μm-thick dry film of each of the photosensitive modified polyimide compositions shown in the above Table 2, which were described in Examples 1 to 6 and Comparative Examples 1 to 4, was provided on both sides of a 25 μm-thick, 200 mm×50 mm polyimide film (KAPTON 100EN, manufactured by Du Pont-Toray Co., Ltd.) to prepare a test piece. The flammability characteristics were evaluated by a method in accordance with the Test for Flammability of Plastic Materials (94UL-VTM) of Underwriters Laboratories Inc. U.S.A. (hereinafter, abbreviated as "UL").

The "VTM" and "NOT" abbreviations in Table 3 were assigned based on the following criteria.

VTM-0: Rating which satisfies all of the following requirements.
(1) None of the test pieces flame for more than 10 seconds after termination of each flame contact.
(2) When five test pieces of one set were contacted with a flame for a total of 10 times, the combined flaming time does not exceed 50 seconds.
(3) Flaming or glowing combustion does not reach the 125 mm mark.
(4) Flaming droplets do not ignite absorbent cotton.
(5) The combined flaming and glowing combustion time of each test piece after termination of the second flame contact does not exceed 30 seconds.
(6) When only one of the five test pieces in the set fails to satisfy the above requirements or when the combined flaming time is in a range of 51 seconds to 55 seconds, additional five test pieces are tested and all of them satisfy the above (1) to (5).

VTM-1: Rating which satisfies all of the following requirements.
(1) None of the test pieces flame for more than 30 seconds after termination of each flame contact.
(2) When five test pieces of one set were contacted with a flame for a total of 10 times, the combined flaming time does not exceed 250 seconds.
(3) Flaming or glowing combustion does not reach the 125 mm mark.
(4) Flaming droplets do not ignite absorbent cotton.
(5) The combined flaming and glowing combustion time of each test piece after termination of the second flame contact does not exceed 60 seconds.
(6) When only one of the five test pieces in the set fails to satisfy the above requirements or when the combined flaming time is in a range of 251 seconds to 255 seconds, additional five test pieces are tested and all of them satisfy the above (1) to (5).

VTM-2: Rating which satisfies all of the following requirements.
(1) None of the test pieces flame for more than 30 seconds after termination of each flame contact.
(2) When five test pieces of one set were contacted with a flame for a total of 10 times, the combined flaming time does not exceed 250 seconds.
(3) Flaming or glowing combustion does not reach the 125 mm mark.
(4) Flaming droplets may ignite absorbent cotton.
(5) The combined flaming and glowing combustion time of each test piece after termination of the second flame contact does not exceed 60 seconds.
(6) When only one of the five test pieces in the set fails to satisfy the above requirements or when the combined flaming time is in a range of 251 seconds to 255 seconds, additional five test pieces are tested and all of them satisfy the above (1) to (5).

NOT: Rating assigned when the test piece does not qualify for any of the above ratings.

HHBT Resistance

The obtained flame-retardant modified polyimide compositions were each coated on a commercially available IPC-C (comb-shaped pattern) substrate (IPC standard) by screen printing using a 165-3D mesh stainless steel plate and the resultant was heated in a hot air oven at 120° C. for 60 minutes and then at 180° C. for 30 minutes. Under an atmosphere having a temperature of 85° C. and relative humidity of 85%, a direct current of 100 V was applied to the thus obtained test pieces. The intralayer insulation resistance value was measured at 1,000 hours later to evaluate the HHBT resistance. The insulation resistance value was determined by maintaining the application of 100 V DC voltage for one minute and then measuring using an electrical insulation tester with the voltage being applied. The judging criteria were as follows.
○: Insulation resistance of not lower than $10^8 \Omega$
×: Insulation resistance of lower than $10^8 \Omega$

TABLE 3

| | Example 1 | Example 2 | Example 3 | Example 4 | Example 5 | Example 6 | Example 7 | Example 8 | Comparative Example 1 | Comparative Example 2 |
|---|---|---|---|---|---|---|---|---|---|---|
| Bending resistance (180° bending) | >20 times | >20 times | >20 times | >20 times | >20 times | >20 times | >20 times | >20 times | >20 times | >20 times |
| Solder heat resistance (260° C. × 5 seconds) | 5 cycles | 5 cycles | 5 cycles | 5 cycles | 5 cycles | 5 cycles | 5 cycles | 5 cycles | 5 cycles | 5 cycles |
| Flammability (UL94VTM) | VTM-0 | VTM-0 | VTM-0 | VTM-0 | VTM-0 | VTM-0 | VTM-0 | VTM-0 | VTM-0 | VTM-0 |
| HHBT resistance | ○ | ○ | ○ | ○ | ○ | ○ | ○ | ○ | ○ | ○ |

Evaluation of Printing Properties

Printing was carried out using a fill mask for testing manufactured by PI R&D Co., Ltd. and MT-550TVC screen printing machine manufactured by Microtek Inc. As the printing plate used in the evaluation, a printing screen for testing manufactured by PI R&D Co., Ltd. (165 mesh-3D, made of stainless steel, emulsion thickness of 15 μm) which has a frame size of 200 mm×250 mm was employed, and the printing was carried out under the following conditions: squeegee speed of 50 to 100 nun/min; gap (clearance) of 1.5 mm to 2.0 mm; and squeegee pressure of 0.1 to 0.2 MPa, and the following characteristics were evaluated.

After continuously carrying out 20 shots of printing on a copper substrate, leveling was performed at room temperature for 5 to 10 minutes. The resultant was heated in a hot air oven at 90° C. for 30 minutes and evaluated visually and under a light microscope. The evaluations were made on the "bleeding", "blurriness" "void or chipping" and "rolling property (defect in the rotating condition when the paste roll-flows on the screen in a substantially cylindrical shape on the frontside of the moving direction of the squeegee when the squeegee moves)". The results of the evaluations are shown in Table 4.

TABLE 4

| Example | Bleeding or sag defect | Blur defect | Void or chipping | Rolling property | Total | Shape evaluation |
|---|---|---|---|---|---|---|
| Example 1 | 0 | 0 | 0 | ◉ | 0 | Good |
| Example 2 | 0 | 0 | 0 | ○ | 0 | Good |
| Example 3 | 0 | 0 | 0 | ○ | 0 | Good |
| Example 4 | 0 | 0 | 0 | ○ | 0 | Good |
| Example 5 | 0 | 0 | 0 | ○ | 0 | Good |
| Example 6 | 0 | 0 | 0 | ◉ | 0 | Good |
| Example 7 | 0 | 0 | 0 | ○ | 0 | Good |
| Example 8 | 0 | 0 | 0 | ◉ | 0 | Good |
| Comparative Example 1 | 0 | 0 | 0 | ◉ | 0 | Good |
| Comparative Example 2 | 0 | 0 | 0 | ○ | 0 | Good |
| Comparative Example 3 | 0 | 0 | 0 | ◉ | 0 | Good |

Continuous Printing Property

This evaluation is for verifying whether printing can be carried out continuously 100 times without changing the film thickness. The above-described fill pattern was continuously printed, and the resultant was sampled at the 10th shot from the start of printing and every 10 shots thereafter until the 100th shot. After drying each sample under the same conditions as described in the above, the same pattern shapes as described in the above were observed visually and under a light microscope. The results of the observations are shown in Table 5. In Table 5, the symbol "○" means that the film shape was good and the symbol "x" means that the film shape was not good. Here, in cases where the shape of the film became considerably deteriorated, the printing was stopped.

TABLE 5

| | The number of continuous shots | | | | | | | | | |
|---|---|---|---|---|---|---|---|---|---|---|
| | 10 | 20 | 30 | 40 | 50 | 60 | 70 | 80 | 90 | 100 |
| Example 1 | ○ | ○ | ○ | ○ | ○ | ○ | ○ | ○ | ○ | ○ |
| Example 2 | ○ | ○ | ○ | ○ | ○ | ○ | ○ | ○ | ○ | ○ |
| Example 3 | ○ | ○ | ○ | ○ | ○ | ○ | ○ | ○ | ○ | ○ |
| Example 4 | ○ | ○ | ○ | ○ | ○ | ○ | ○ | ○ | ○ | ○ |
| Example 5 | ○ | ○ | ○ | ○ | ○ | ○ | ○ | ○ | ○ | ○ |
| Example 6 | ○ | ○ | ○ | ○ | ○ | ○ | ○ | ○ | ○ | ○ |
| Example 7 | ○ | ○ | ○ | ○ | ○ | ○ | ○ | ○ | ○ | ○ |
| Example 8 | ○ | ○ | ○ | ○ | ○ | ○ | ○ | ○ | ○ | ○ |
| Comparative Example 1 | ○ | ○ | ○ | ○ | ○ | ○ | ○ | ○ | ○ | |
| Comparative Example 2 | ○ | ○ | ○ | ○ | ○ | ○ | ○ | ○ | ○ | |
| Comparative Example 3 | ○ | ○ | ○ | ○ | ○ | ○ | ○ | ○ | ○ | |

As seen from the results shown in Tables 4 and 5, the photosensitive polyimide printing ink according to the present invention had excellent film shape and continuous printing property.

Preparation of FPC

The positive-type photosensitive modified resin compositions of Examples 1 to 8 and Comparative Examples 1 to 3 were each screen printed on a FPC board as a photosensitive cover lay. The resulting boards were prebaked and then sequentially subjected to the steps of exposure, development and after-baking (120° C.×60 minutes+180° C.×30 minutes). Thereafter, electrolytic gold plating was performed to prepare FPCs having the protective film.

Gold Plating

Gold plating was performed by conventional electrolytic gold plating and electroless gold plating. That is, the gold plating was performed in accordance with the following steps. Specifically, samples were sequentially immersed in the bath of each step and then dried.

Electrolytic Gold Plating Steps:

degreasing treatment (acid or alkaline degreasing), washing with water, acid treatment, washing with water, soft etching, washing with water, pre-dipping treatment (acid treatment), washing with water, electrolytic nickel (Watt bath) plating, washing with water, electrolytic gold (gold potassium cyanide) plating, washing with water, and drying Electroless Gold Plating Steps:

degreasing treatment (acid or alkaline degreasing), washing with water, acid treatment, washing with water, soft etching, washing with water, pre-dipping treatment (acid treatment), catalyzation with palladium chloride, washing with water, electroless nickel plating step (nickel nitrate), washing with water, electroless gold (gold potassium cyanide) plating, washing with water, and drying Evaluation of Laminate Using ESPANEX M (manufactured by Nippon Steel Chemical Co., Ltd.; the insulating layer has a thickness of 25 μm and the conductor layer is the copper foil F2-WS (18 μm)) as substrate of flexible printed circuit board, a comb-shaped circuit board having line/space of 30 μm/30 μm, 50 μm/50 μm, 100 μm/100 μm and 200 μm/200 μm was prepared. The obtained positive-type photosensitive modified polyimide compositions were each partially printed on the thus prepared circuit board, and the resultants were prebaked. A mask was used for those parts subjected to plating, and the steps of exposure, development and after-baking (120° C.×60 minutes+180° C.×30 minutes) were carried out. On those parts that were opened in the exposure and development steps, electrolytic nickel-gold plating or electroless nickel-gold plating was performed to a nickel thickness of about 3 to 5 μm and a gold thickness of about 0.03 to 0.07 μm. Penetration of the plating from the open parts into the inner part was verified by micro X-ray fluorescence analysis or cross-sectional observation. The results thereof are shown in Table 6.

TABLE 6

Results of Plating Test

| | Amount of the plating impregnated into the circuit wiring (μm) | | | |
|---|---|---|---|---|
| Example | Electrolytic nickel plating | Electrolytic gold plating | Electroless nickel plating | Electroless gold plating |
| Example 1 | <20 | <20 | <20 | <20 |
| Example 2 | <20 | <20 | <20 | <20 |
| Example 3 | <20 | <20 | <20 | <50 |

TABLE 6-continued

Results of Plating Test

| Example | Amount of the plating impregnated into the circuit wiring (μm) | | | |
| --- | --- | --- | --- | --- |
| | Electrolytic nickel plating | Electrolytic gold plating | Electroless nickel plating | Electroless gold plating |
| Example 4 | <50 | <20 | <20 | <20 |
| Example 5 | <50 | <50 | <50 | <50 |
| Example 6 | <20 | <20 | <20 | <50 |
| Example 7 | <50 | <20 | <20 | <20 |
| Example 8 | <50 | <50 | <50 | <50 |

INDUSTRIAL APPLICABILITY

The positive-type photosensitive modified polyimide composition according to the present invention is suitable as a photosensitive ink used in: formation of a protective layer of flexible circuit boards and circuit substrates that are used in operational panels and the like of various electronic instruments in the field of electronics; formation of an insulating layer of laminate substrates; and formation of a film in electronic components which is used for protection, insulation and adhesion of silicon wafers utilized in semiconductor devices, semiconductor chips, peripheral parts of semiconductor devices, substrates for mounting semiconductor chips, radiator plates, lead pins and semiconductors themselves.

In those conventional polyimide films that are used for surface protective films and interlayer insulation films employed as industrial coating materials of electronic components such as surface coating materials of flexible printed boards, inner-layer coating materials of multi-layer rigid substrates, liquid-crystal alignment films and coating materials of ICs and LSIs, in order to form a hole on the coverlay film at a prescribed position, laser etching, plasma etching or the like have been carried out. These methods have very good positioning accuracy; however, they have disadvantages in that the hole formation is time-consuming and that the apparatus therefor and operational cost are expensive. In recent years, since the photo-printing technology using a photosensitive polyimide have been largely advanced, the image-forming step has been more simplified and polyimides have been used more widely in the field of electronics. By performing exposure and development steps using the photosensitive polyimide ink composition according to the present invention, images can be formed with a more simplified fine-patterning process as compared to conventional photo-etching method.

The invention claimed is:

1. A photosensitive modified polyimide resin composition, which comprises a modified polyimide represented by the following Formula (I):

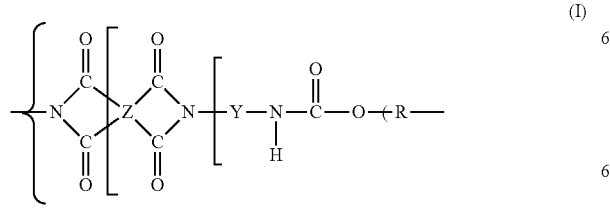

(I)

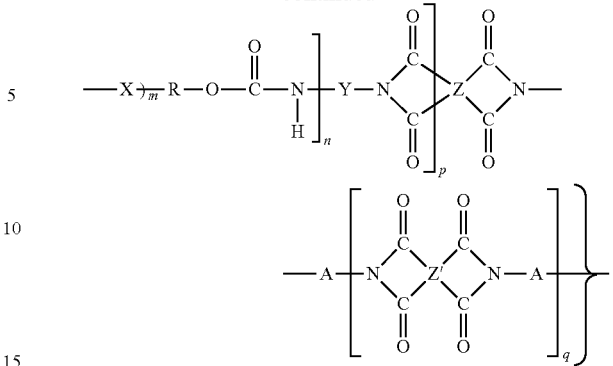

(wherein each R independently represents a $C_1$-$C_{18}$ alkylene group; each X independently represents a carbonate group, ester group or urethane group; each Y independently represents a $C_1$-$C_{18}$ alkylene group or arylene group; A represents a divalent organic group which is the part of a diamine other than the amino groups thereof; Z and Z' represent a tetravalent organic group which is the part of a tetracarboxylic acid other than the carboxyl groups thereof; at least one of A, Z and Z' has a free hydroxyl group(s) and/or carboxyl group(s); and m, n, p and q each independently represents an integer of 1 to 20);

and a photosensitizer.

2. The composition according to claim 1, wherein said photosensitizer is a positive-type photosensitizer.

3. The composition according to claim 1 or 2, wherein said modified polyimide represented by said Formula (I) further comprises a reactive group at a terminal thereof to have thermosetting property.

4. The composition according to claim 1, wherein the weight ratio of the repeating units whose number is represented by said n in said Formula (I) to said modified polyimide represented by said Formula (I) is 0.3 to 0.7 (with the proviso that the weight of Y is excluded when Y is aromatic).

5. The photosensitive modified polyimide resin composition according to claim 1, wherein said photosensitizer is naphthoquinone diazide sulfonyl ester, which is an aromatic polyhydroxy compound, or a quinonediazide compound.

6. The composition according to claim 1, which further comprises 1 to 20 parts by weight of a non-halogen-based flame retardant with respect to 100 parts by weight of said modified polyimide.

7. The composition according to claim 6, wherein said non-halogen-based flame retardant is a hydrated metal compound such as a non-halogen metal hydroxide, a phosphate compound or a phosphazene compound.

8. A photosensitive resin film, which is obtained by forming a film of the composition according to claim 1 and heating the thus obtained film to remove said solvent.

9. A method of preparing a patterned polyimide resin film, which comprises the steps of: coating the composition according to claim 1 on a substrate to form a film; heating the thus obtained film to remove said solvent; exposing through a mask said composition from which said solvent was removed; developing the resultant after said exposure; and, after said development, heating the resultant to a temperature of 120° C. to 200° C.

10. The method according to claim 9, wherein said substrate is a printed circuit board or FPC board having wiring formed thereon.

11. A printed circuit board or FPC, which comprises a patterned polyimide resin film prepared by the method according to claim 10.

* * * * *